United States Patent [19]

Tajime et al.

[11] Patent Number: 5,225,694

[45] Date of Patent: Jul. 6, 1993

[54] ONE DIMENSIONAL T.D.I OPERATION SOLID-STATE IMAGER

[75] Inventors: Tooru Tajime, Kamakura; Shinsuke Nagayoshi, Itami, both of Japan

[73] Assignee: Mitsubishi Denki Kabushiki Kaisha, Tokyo, Japan

[21] Appl. No.: 745,707

[22] Filed: Aug. 16, 1991

[30] Foreign Application Priority Data

Aug. 17, 1990 [JP] Japan .................. 2-217337

[51] Int. Cl.[5] .............. H01L 29/78; H01L 27/14; H01L 31/00
[52] U.S. Cl. ......................... 257/230; 257/234
[58] Field of Search ............. 357/24 LR, 24, 24 M; 377/61, 62, 63; 358/213.15, 213.16, 213.19, 213.23, 213.26; 257/230, 229, 234, 231, 232, 233

[56] References Cited

U.S. PATENT DOCUMENTS

| 4,173,772 | 11/1979 | White ................... | 358/213 |
|---|---|---|---|
| 4,264,930 | 4/1981 | White ................... | 358/213 |
| 4,317,134 | 2/1982 | Woo ..................... | 358/213 |
| 4,489,423 | 12/1984 | Suzuki ................. | 357/24 LR |
| 4,675,549 | 6/1987 | Steffe et al. ........ | 307/311 |
| 4,870,293 | 9/1989 | Elabd ................... | 250/578 |
| 4,949,172 | 8/1990 | Hunt et al. .......... | 358/101 |

OTHER PUBLICATIONS

Dereniak et al., "Time-Delay Integration (TDI)", Optical Radiation Detectors, 1984, pp. 254-256.
White et al., "A Multiple-Gate CCD-Photo-Diode Sensor Element for Imaging Arrays,", IEEE Transactions on Electron Devices, Feb. 1978, pp. 125-131.
Heyns et al., "The Resistive Gate CTD Area-Image Sensor,", IEEE Transactions on Electron Devices, Feb. 1978, pp. 135-139.

Primary Examiner—Andrew J. James
Assistant Examiner—Ngan Van Ngo
Attorney, Agent, or Firm—Leydig, Voit & Mayer

[57] ABSTRACT

A one-dimensional time-delay integration solid-state imager includes a plurality of light-to-electricity conversion parts which store signal charges generated in response to incident light, a vertical CCD corresponding to a series of the light-to-electricity conversion parts for transferring stored signal charges, and a gate for controlling transfer of signal charges stored at the light-to-electricity conversion parts to the vertical CCD. The signal charges corresponding to the same observed image moving on the plurality of light-to-electricity conversion parts are added to enhance the signal-to-noise ratio, and a background signal charge removing region for removing background signal charges is provided at the vertical CCD for removing background charges during the transfer of signal charges.

4 Claims, 11 Drawing Sheets

ONE DIMENSIONAL T.D.I OPERATION SOLID-STATE IMAGER

FIELD OF THE INVENTION

The present invention relates to a one-dimensional solid-state imager with time-delay integration and more particularly to an improvement in the performance thereof.

BACKGROUND OF THE INVENTION

Conventionally when a one-dimensional solid-state imager is used to observe an object that moves at a high speed, there is a problem in that the signal-to-noise ratio of an output signal is reduced. This is because the storage time of signal charges at the light-to-electricity conversion part is too short and the signal charge amount corresponding to the observed image is too small. In order to solve this problem, it is proposed to enhance the signal-to-noise ratio of the output signal by adding signal charges corresponding to the same observed image to signal charges produced by observed images that move on the light-to-electricity conversion part. Such operation is called T.D.I. (Time-Delay Integration) operation and this operation is effective only in the one-dimensional solid-state imager. A solid-state imager of T.D.I. operation type will be described with reference to the drawings.

FIG. 3 shows a construction of a prior art one-dimensional T.D.I. type solid-state imager. In FIG. 3, a light-to-electricity conversion part 1 is provided for storing signal charges which are generated in accordance with the light incident to the imager. A vertical charge transfer part (hereinafter referred to as vertical CCD) constituted by a charge coupled device (hereinafter referred as CCD) is provided for transferring charges generated at the light-to-electricity conversion part 1 in the vertical direction. A horizontal charge transfer part 3 (hereinafter referred to as a horizontal CCD) is provided for receiving signal charges transferred by the vertical CCD 2 and transferring the same in the horizontal direction. A transfer gate 4 is provided between the light-to-electricity conversion part 1 and the vertical CCD 2 for controlling the transfer of the signal charges at the light-to-electricity conversion part 1 to the vertical CCD 2. An output part 5 is provided for outputting the signal charges transferred by the horizontal CCD 3. Here, the arrow M represents the direction in which the observed image focused on the imager moves. Reference characters A to D designate regions on which a part of the observed image is focused.

Now, it is assumed that a part of the observed image is focused on the region A. When a part of the observed image is supposed to be $O_1$, signal charges in accordance with the observed image $O_1$ are stored at the light-to-electricity conversion part 1. The stored signal charges are read out to the vertical CCD 2 by turning on the transfer gate 4 while the observed image $O_1$ moves from the region A to the region B. The read out signal charges are transferred in the vertical CCD 2 in the vertical direction. The transfer speed then is equal to the velocity of the observed image.

Subsequently thereto, after the observed image $O_1$ has reached the region B, signal charges corresponding to the observed image $O_1$ are stored at the light-to-electricity conversion part 1 of the region B. The amount of the stored signal charges is equal to the signal charges stored at the light-to-electricity conversion part 1 of the region A. Then, the next observed image $O_2$ is focused on the region A. Then signal charges stored at the light-to-electricity conversion part 1 of the region B are read out to the vertical CCD 2 from the light-to-electricity conversion part 1 by turning on the transfer gate becomes "ON" state while the observed image $O_1$ moves to the region C from the region B after a predetermined storage time, and are added to the signal charges read out at the region A which are transferred to this part of the vertical CCD 2. In this way, the total signal charge amount corresponding to the observed image $O_1$ is doubled. Accordingly, when this operation is repeated n times with n light-to-electricity conversion parts 1 in the vertical direction, the signal charge amount is multiplied n times and the shot noise becomes $\sqrt{n}$ times. The signal charges thus accumulated n times in the charge amount in the vertical CCD 2 are moved to the horizontal CCD 3 and transferred to the output part 5 to be output.

When the T.D.I. operation is repeated n times in this way, the signal-to-noise ratio in the vertical CCD 2 is improved by $\sqrt{n}$ times.

In the prior art one-dimensional solid-state imager carrying out T.D.I. operation, when n light-to-electricity conversion parts are used, n times the original signal charge is stored at the part of the vertical CCD relative to those which do not carry out T.D.I. operation. However, if the capacity of the vertical CCD is equal to that of the prior art one-dimensional solid-state imager, an overflow of charges arises in the vertical CCD and the observed image is not correctly recognized, and blooming results. If the capacitance of CCD is assumed to be in proportion to the area of the vertical CCD, this means that the area of the vertical CCD is increased. When a fundamental cell (hereinafter referred to as a pixel) is assumed to be constituted by the light-to-electricity conversion part, the transfer gate corresponding thereto, and the vertical CCD, the numerical aperture, which is a reference value of sensitivity in the general solid-state imager is defined as in the following. That is, the numerical aperture is a ratio of the area which is occupied by the light-to-electricity conversion part to the total pixel area. From this value, it is apparent that as the area other than the light-to-electricity conversion part becomes small inside the pixel, the numerical aperture is increased and the sensitivity is also increased. Accordingly, in the prior art device carrying out T.D.I. operation, when the area of the vertical CCD is increased to prevent blooming, the numerical aperture is reduced and, as a result, enhancement of sensitivity which is an object of the T.D.I. operation is prevented.

SUMMARY OF THE INVENTION

It is an object of the present invention to provide a one-dimensional solid-state imager using T.D.I. operation with enhanced sensitivity without lowering the numerical aperture.

Other objects and advantages of the present invention will become apparent from the detailed description given hereinafter; it should be understood, however, that the detailed description and specific embodiment are given by way of illustration only, since various changes and modifications within the spirit and the scope of the invention will become apparent to those skilled in the art from this detailed description.

In accordance with the present invention, in a T.D.I. operation type sold-state imager, a region for removing charges corresponding to the background light component included in the signal charges that are successively increased by the T.D.I. operation while being transferred in the vertical CCD is provided in the vertical CCD. Therefore, signal charges read out of the light-to-electricity conversion part have removed each time the charges are transferred the background signal charges in the vertical CCD, so that the increase in the signal charges in the vertical CCD is suppressed to the lowest amount and as a result, a T.D.I. operation type solid-state imager having a good operation sensitivity is obtained.

DETAILED DESCRIPTION OF THE PREFERRED EMBODIMENTS

An embodiment of the present invention will be described in detail with reference to the drawings.

Figure 1:
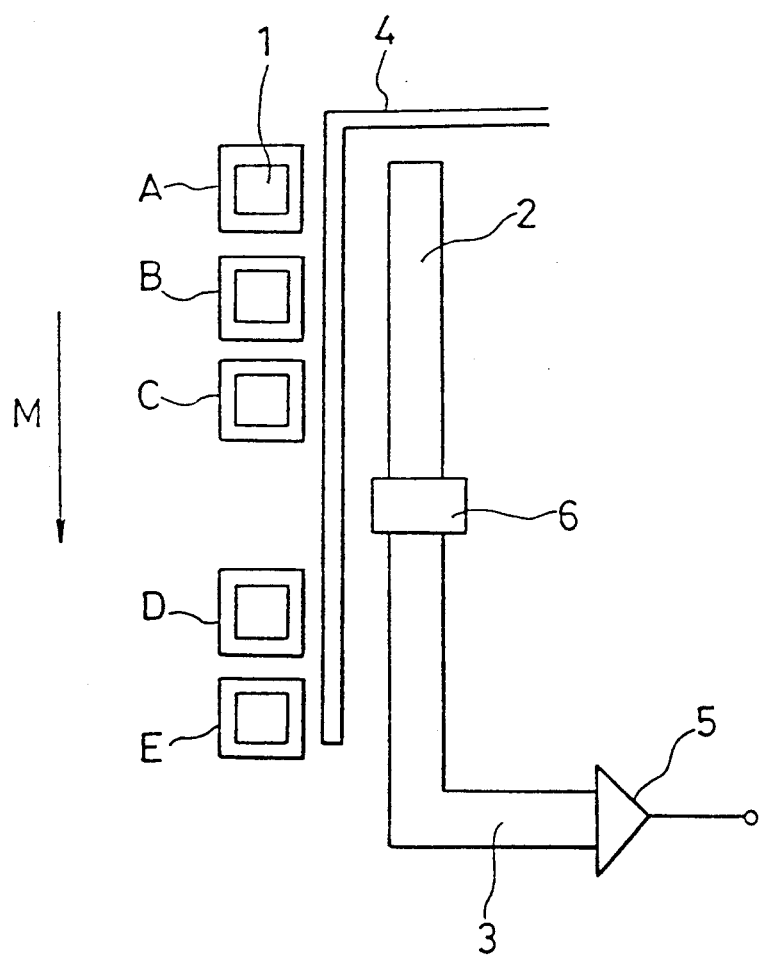
FIG. 1 is a diagram showing a construction of a T.D.I. operation type solid-state imager in accordance with an embodiment of the present invention.
Figure 3:
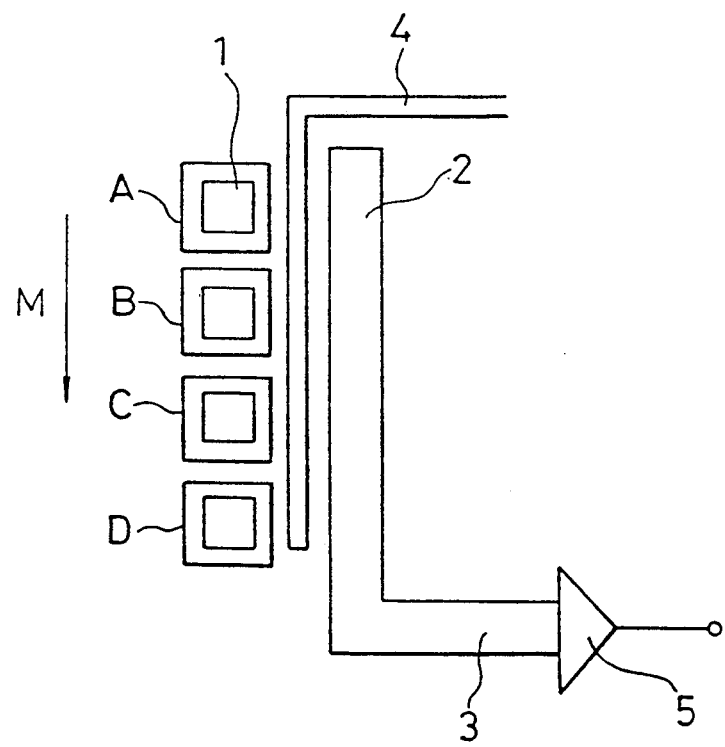
FIG. 3 is a diagram showing a construction of a prior art solid-state imager.

FIG. 1 is a diagram showing a construction of a T.D.I. operation type solid-state imager in accordance with a first embodiment of the present invention. In FIG. 1 the same reference numerals designate the same or corresponding parts as those shown in FIG. 3. Numeral 6 designates a background signal removing part which is provided at an appropriate position of the CCD. In the figure, the arrow M designates a direction in which the observed image which is focused on the imaging device moves. Reference characters A to E designate regions where a part of the observed image is focused.

Figure 2:
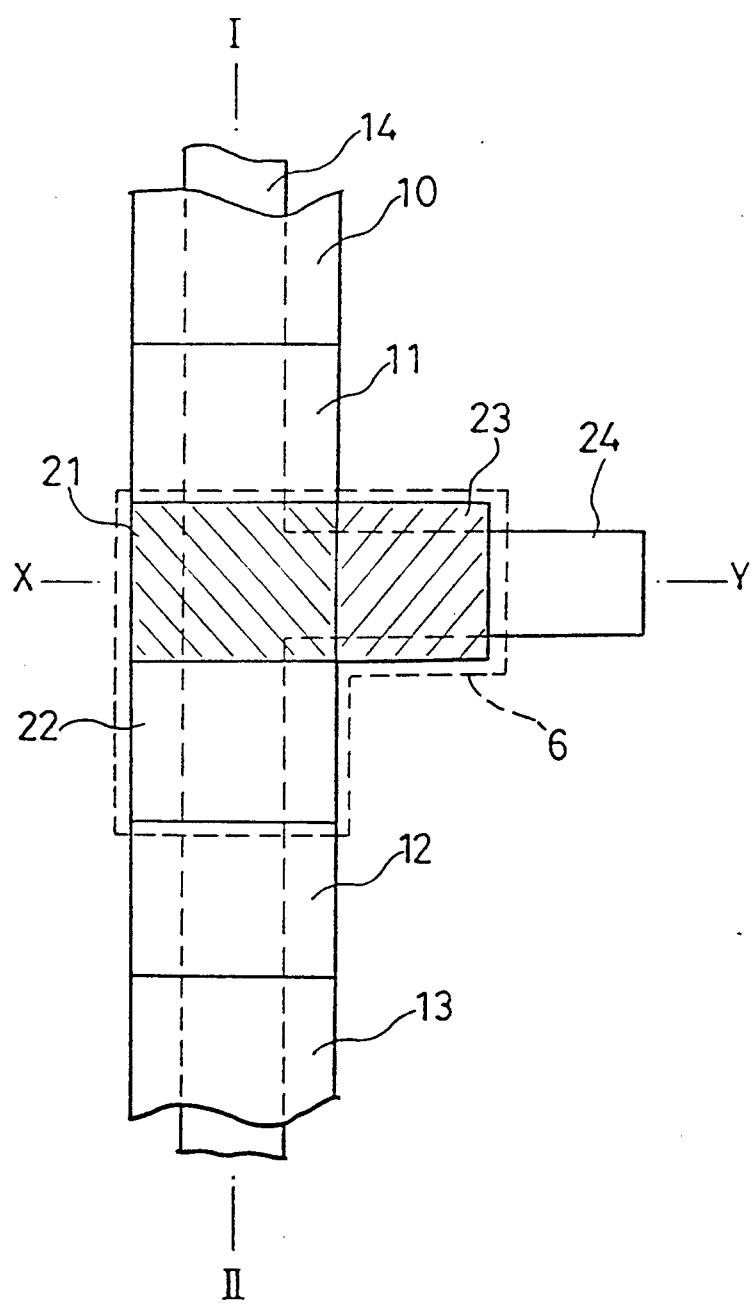
FIG. 2 is a diagram showing a detailed construction of a background signal charge removing part of the T.D.I. operation type solid-state imager of FIG. 1.

FIG. 2 shows a detailed construction of the background signal charge removing part 6 shown in FIG. 1. In FIG. 2, vertical CCD gate electrodes 10 to 13 are provided for controlling signal charge transfer in the vertical CCD 2. An n type region 14 is provided for transferring signal charges in the vertical CCDs 10 to 13. A storage gate electrode 21 is provided for storing signal charges transferred to the background signal charge removing part 6. A charge removal control gate electrode 23 is provided for removing background signal charges from the signal charges transferred from the vertical CCD. A drain region (n type region) 24 is provided for transferring signal charges removed by the control gate electrode 23.

Figure 4A:
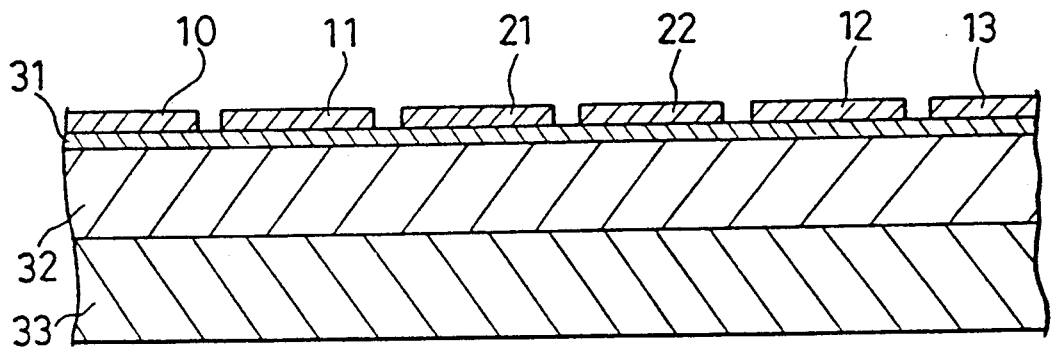
FIGS. 4(a) and 4(b) are diagrams showing cross-sectional views along lines I–II, and X–Y of FIG. 2, respectively.
Figure 4B:
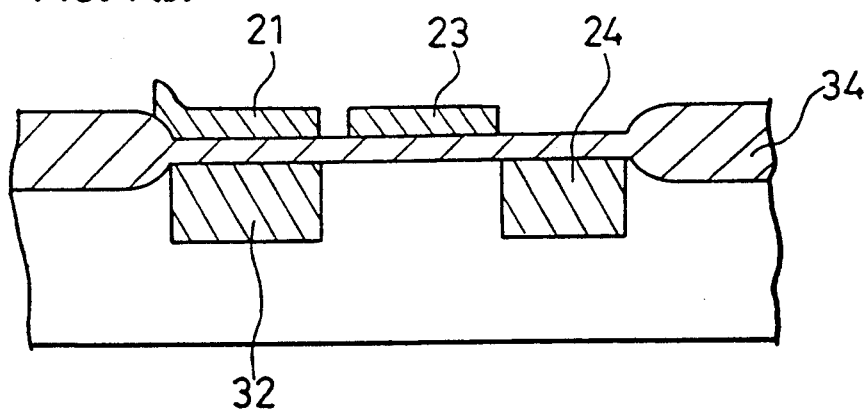

FIGS. 4(a) and 4(b) show cross-sections along lines I–II, X–Y of FIG. 2, respectively. Numeral 31 designates a gate oxide film and numeral 32 designates a vertical CCD. Numeral 33 designates a p type semiconductor substrate and numeral 34 designates a separating oxide film.

A description is given of the operation hereinafter.

Now it is supposed that a part of the observed image is focused on the region A. When the part of the observed image is assumed to be $O_1$, charges in accordance with the observed image $O_1$ are stored at the light-to-electricity conversion part 1 of the region A. These stored charges are read out to the vertical CCD 2 when the transfer gate 4 is turned on while the observed image $O_1$ is moving to the region B from the region A. The read out signal charges are transferred in the vertical CCD 2 in the vertical direction. The transfer speed then is equal to the moving speed of the observed image.

Subsequently thereto, when the observed image $O_1$ reaches the region B, signal charges in accordance with the observed image $O_1$ are stored at the light-to-electricity conversion part 1 of the region B. Then, the next observed image $O_2$ is focused on the region A. The signal charges stored at the light-to-electricity conversion part 1 of the region B are read out to the vertical CCD 2 from the light-to-electricity conversion part 1 when the transfer gate is turned on at a time when signal charges read out from the region A, while the observed image $O_1$ moves from the region B to the region C, are transferred to a part of the vertical CCD 2 corresponding to the light-to-electricity conversion part 1 of the region B, and added to the signal charges read out at the region A. Thereby, the signal charge amount corresponding to the observed image $O_1$ is doubled. An operation similar to that in the region B occurs at the region C, and signal charges in accordance with the observed image $O_1$ are added at the part of the vertical CCD 2 in accordance with the light-to-electricity conversion part 1 of the region C, amounting to three times the original charge amount. These signal charges are transferred in the vertical CCD 2 in the vertical direction at the same speed as that of the moving speed of the observed image $O_1$ while the observed image $O_1$ moves from the region C to the region D, and extra signal charges are removed by the background signal charge removing part 6.

Figure 5:
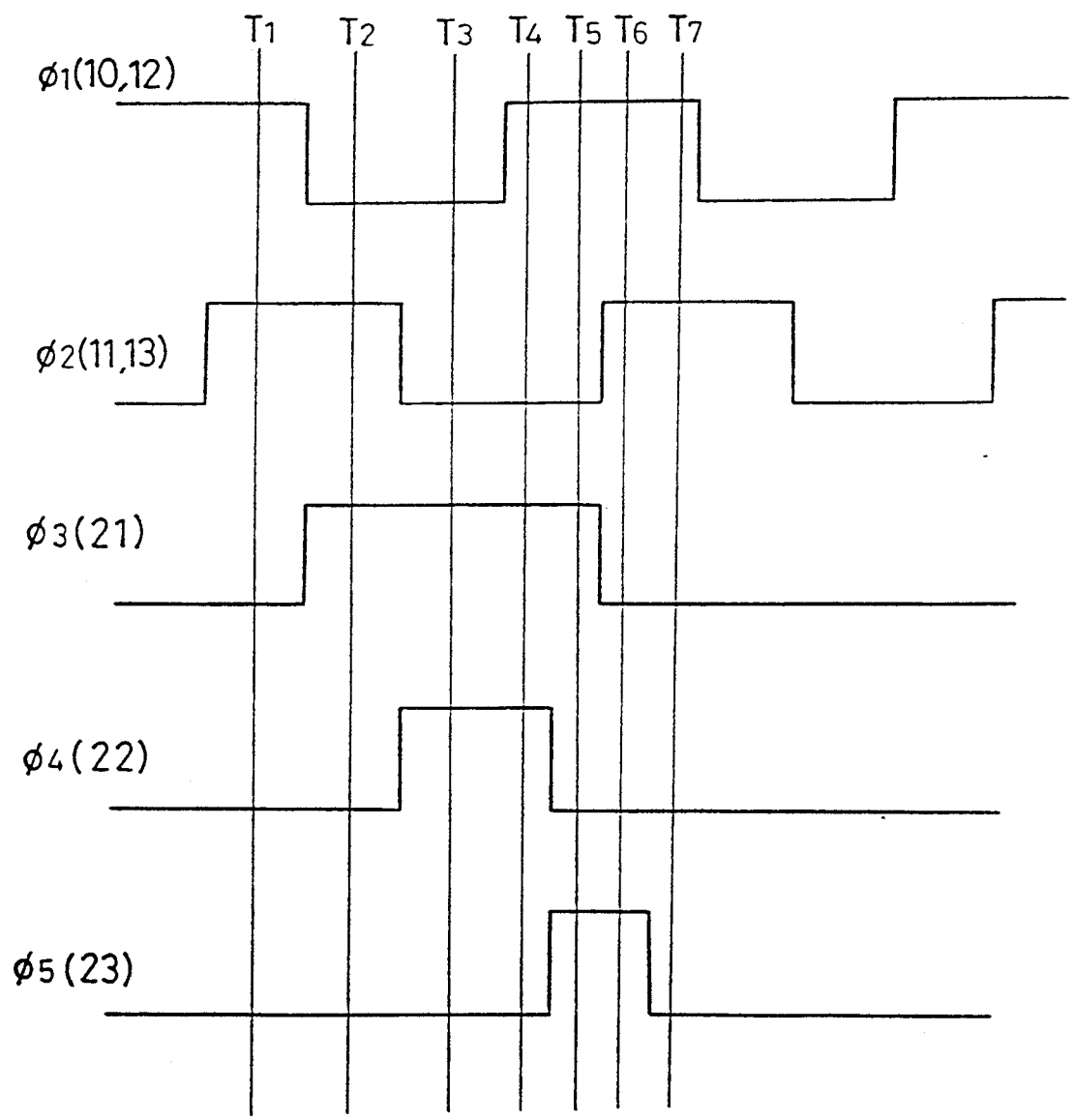
FIG. 5 is a diagram showing the timing of clock pulses applied to the gate electrodes of the T.D.I. operation type solid-state imager of FIG. 2.
Figure 6:
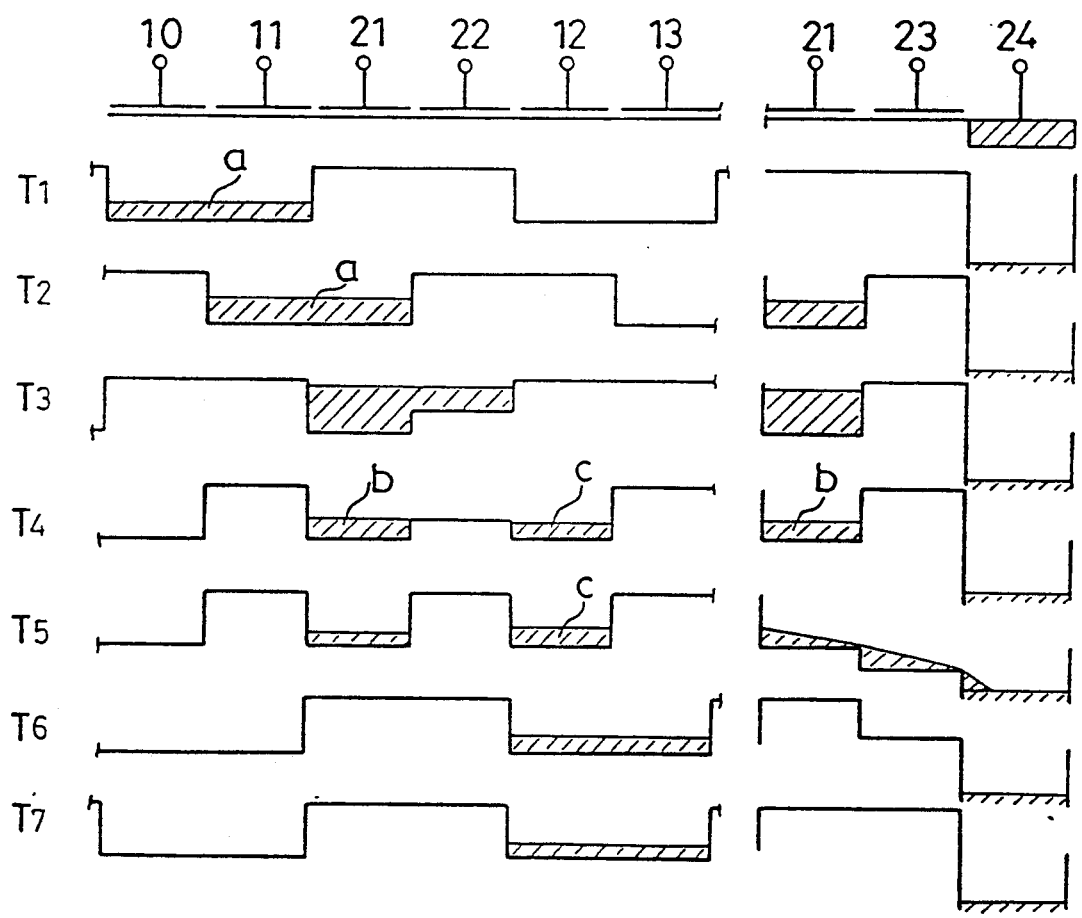
FIG. 6 is a diagram showing potentials of the background signal charge removing part of the T.D.I. operation type solid-state imager of FIG. 2.
Figure 7:
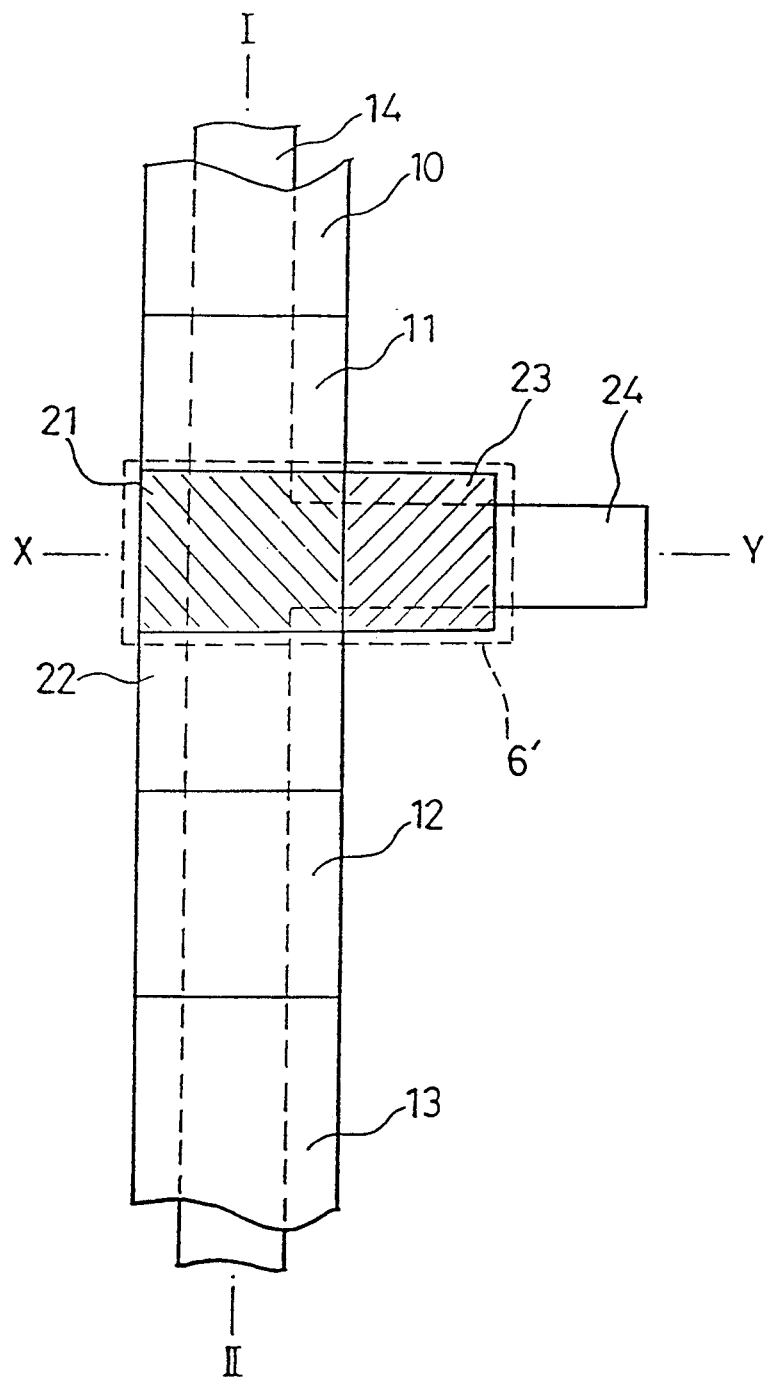
FIG. 7 is a diagram showing a construction of a background signal removing part of the T.D.I. operation type solid-state imager of FIG. 1.
Figure 8A:
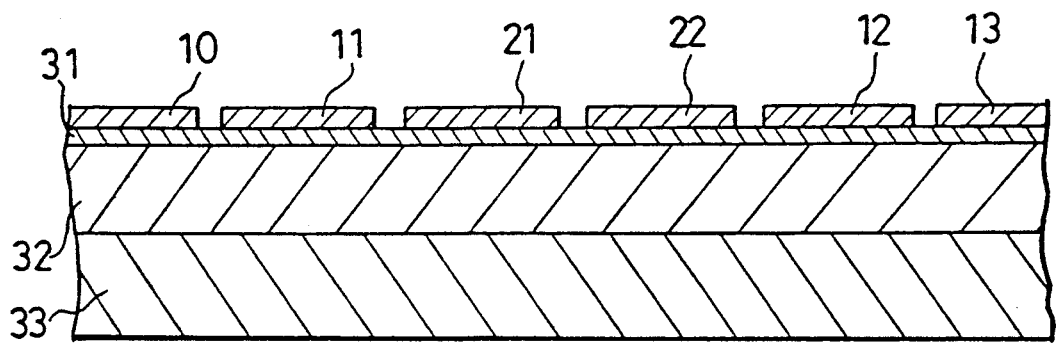
FIGS. 8(a) and 8(b) are cross-sectional views along lines I–II, and X–Y of FIG. 7, respectively.
Figure 8B:
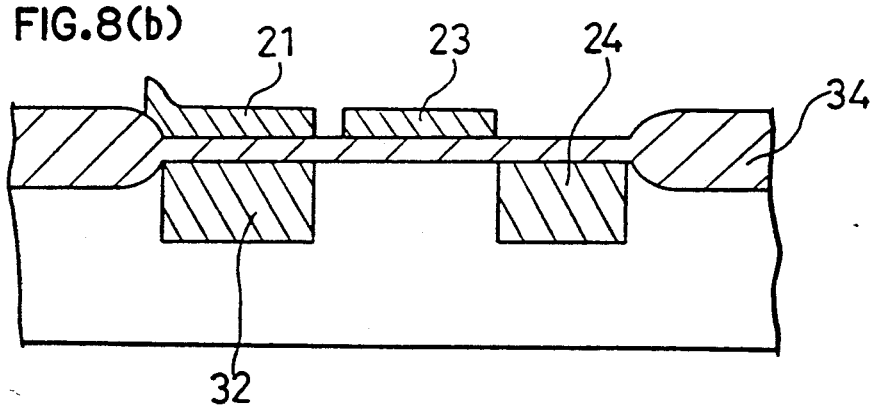
Figure 9:
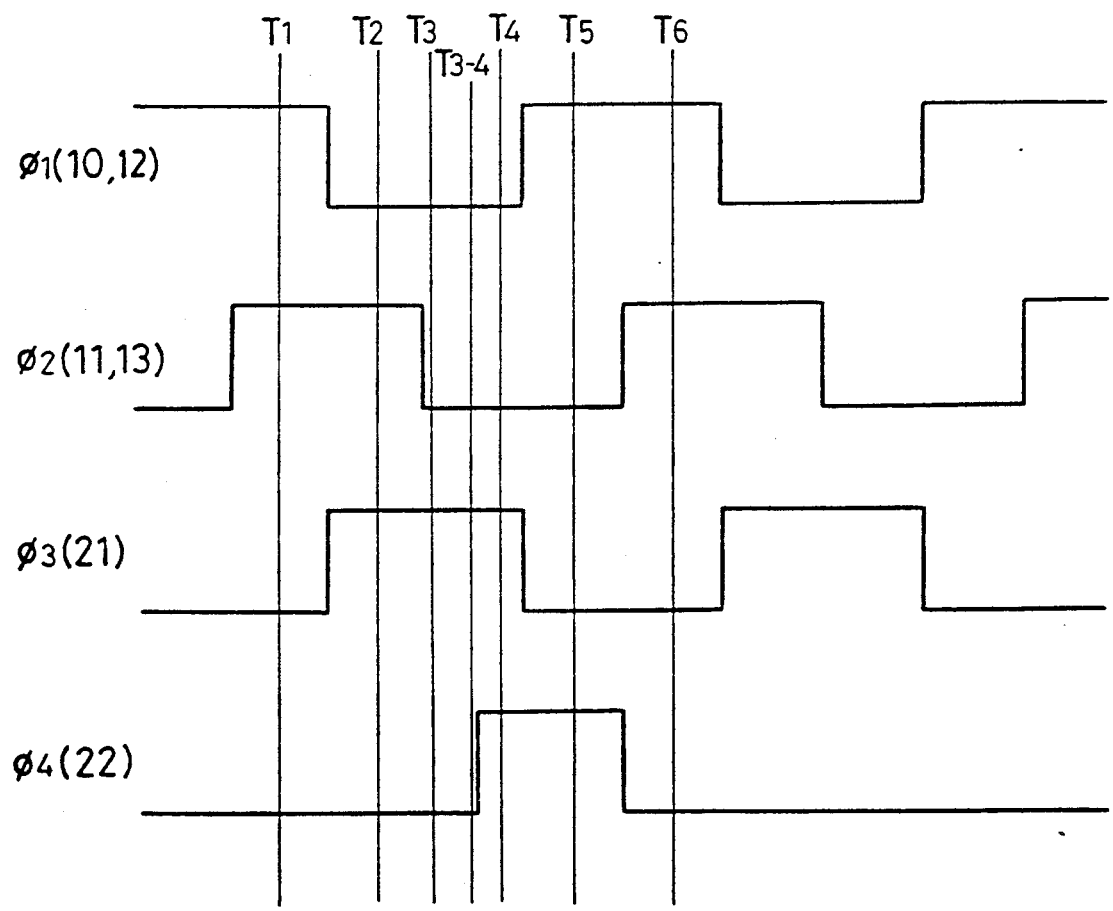
FIG. 9 is a diagram showing the timing of clock pulses applied to the gate electrodes of the T.D.I. operation type solid-state imager in accordance with another embodiment of the present invention.

A description is given of the operation of the background signal charge removing part 6 with reference to FIGS. 5 and 6. FIG. 5 shows the timing at which clock pulses are applied to respective gate electrodes in FIG. 2. The clock pulse $\phi_1$ is applied to the gate electrodes 10 and 12, the clock pulse $\phi_2$ is applied to the gate electrodes 11 and 13, the clock pulse $\phi_3$ is applied to the storage electrode 21, the clock pulse $\phi_4$ is applied to the charge transfer control electrode 22, and the clock pulse $\phi_5$ is applied to the charge removal control gate electrode 23. FIG. 6 shows a potential diagram in accordance with FIG. 2. In FIG. 6, reference characters $T_1$ to $T_7$ correspond to times $T_1$ to $T_7$ in FIG. 5. Reference characters a, b, and c designate signal charges and a represents signal charges which have increased by the T.D.I. operation, b represents background signal charges, and c represents signal charges after the background signal charges b are removed.

At time $T_1$, the clock pulses $\phi_1$ and $\phi_2$ applied to the gate electrodes 10 and 11 are high voltages and a potential well is produced at and below these gate electrodes. Signal charges which are transferred by the vertical CCD 2 are stored at the well.

During the period from time $T_1$ to time $T_2$, the voltage of the clock pulse $\phi_1$ is lowered and the voltage of the clock pulse $\phi_3$ is raised and accompanying therewith the potential below the gate electrode 10 is raised and the potential below the storage gate electrode 21 is lowered. Thereby, the potential well changes as shown in the figure and as a result, the signal charges move to below the gate electrodes 11 and 21 from below the gate electrodes 10 and 11.

During the period from time $T_2$ to timing $T_3$, the voltage of the clock pulse $\phi_2$ is lowered and the voltage of the clock pulse $\phi_4$ is raised. Accompanying therewith, the potential wells change as shown in the drawing. Then, the voltage of the clock pulse $\phi_4$ is controlled such that the potential below the charge transfer control gate electrode 22 becomes higher than that below the storage gate electrode 21. The background signal charges are removed by utilizing this potential difference.

That is, during the period from time $T_3$ to time $T_4$, the voltage of the clock pulse $\phi_1$ is raised and a potential well is produced below the gate electrode 12 and a part c of signal charges stored below the storage gate electrode 21 and below the charge transfer control gate electrode 22 move to below the gate electrode 12. Then, the potential below the storage gate electrode 21 and that below the charge transfer control gate electrode 22 have a difference in their depth and therefore, signal charges b, in accordance with the potential, remain below the storage gate electrode 21.

During the period from time $T_4$ to time $T_5$, the voltage of the clock pulse $\phi_5$ is raised and the voltage of the clock pulse $\phi_4$ is lowered. Accompanying therewith, the potential below the charge removing control gate electrode 23 is lowered and the potential below the charge transfer control gate electrode 22 is raised. As a result, signal charges b remaining below the storage gate electrode 21 are drained through the drain 24.

During the period from time $T_5$ to time $T_6$, the voltage of the clock pulse $\phi_3$ is lowered and the potential below the storage gate electrode 21 is raised. As a result, the signal charges below the storage gate electrode 21 are completely drained. Further, the voltage of the clock pulse $\phi_2$ is raised and a potential well is produced below the gate electrode 13. As a result, signal charges stored at and below the gate electrode 12 move also to and below the gate electrode 13.

During the period from time $T_6$ to time $T_7$, the voltage of the clock pulse $\phi_5$ is lowered and the charge removal control gate electrode 23 is raised. Thereby, the gate for draining the background signals is closed, i.e., off.

In this way, by controlling the voltage of the clock pulse $\phi_4$ applied to the charge transfer control gate electrode 22, it is possible to remove the background signal charges.

Next, a description is given of the control of the voltage of the clock pulse $\phi_4$. At first, the front face of the photodetector is covered by a piece of black paper. Next, while the photodetector is usually operated, the voltage of the clock pulse $\phi_4$ is changed and the output of the horizontal CCD is output slightly. The value of the voltage of the clock pulse $\phi_4$ is a value to be applied to the charge transfer control gate electrode in order to remove the background signals.

The signal charges from which the background signal charges are removed are transferred to the horizontal CCD 3 in the vertical direction Signal charges which are obtained by repeating the above-described operation are transferred to the horizontal CCD 3 from the vertical CCD 2 and transferred on the horizontal CCD 3 to the output part 4.

A description is given of another embodiment of the present invention.

In this embodiment the removal of background signal charges is carried out by the charge removal control gate electrode 23. The operation will be described with reference to FIGS. 7 to 10.

In this case, the background signal charge removing part is a region shown by 6' and at time $T_1$, the clock pulses $\phi_1$ and $\phi_2$ applied to the gate electrodes 10 and 11 are both at high voltages and a potential well is produced at and below the gate electrodes 10 and 11 and signal charges transferred by the vertical CCD 2 are stored thereat. In addition, a predetermined voltage is always applied to the charge removal control gate electrode 23 and the potential below the gate electrode is lowered by a voltage corresponding to the voltage applied.

During the period from time $T_1$ to time $T_2$, the voltage of the clock pulse $\phi_1$ is lowered and the voltage of the clock pulse $\phi_3$ applied to the storage gate electrode 21 is lowered. Accompanying therewith, the potential well produced at and below the gate electrodes 10 and 11 change as shown by $T_2$. As a result, the signal charges a move to below the gate electrodes 11 and 21. During the period from time $T_2$ to time $T_3$, the voltage of the clock pulse $\phi_2$ is lowered and signal charges a at and below the gate electrode 11 move to and below the storage gate electrode 21. Then, the potential of the charge removal control gate electrode 23 is a little lowered and the part of signal charges collected at the storage gate electrode 21 exceeding the potential of the charge removal control gate electrode 23 pour out of the drain 24. The poured signal charges b are drained through the drain 24.

Accordingly, as similarly in the above-embodiment, by controlling the voltage applied to the charge removal control gate electrode 23, it is possible to remove a part of the signal charges a stored at and below the storage gate electrode 21. The signal charge amount to be removed is made to coincide with the background signal charge amount by a method similar to that described in the above-embodiment. Here in this embodiment, in order to control the output, it is enough to control the voltage applied to the charge removal control gate electrode 23. In this way, signal charges c from which a part of signal charges are removed are stored at and below the storage gate electrode 21 as shown by $T_{3-4}$ of FIG. 10.

Figure 10:
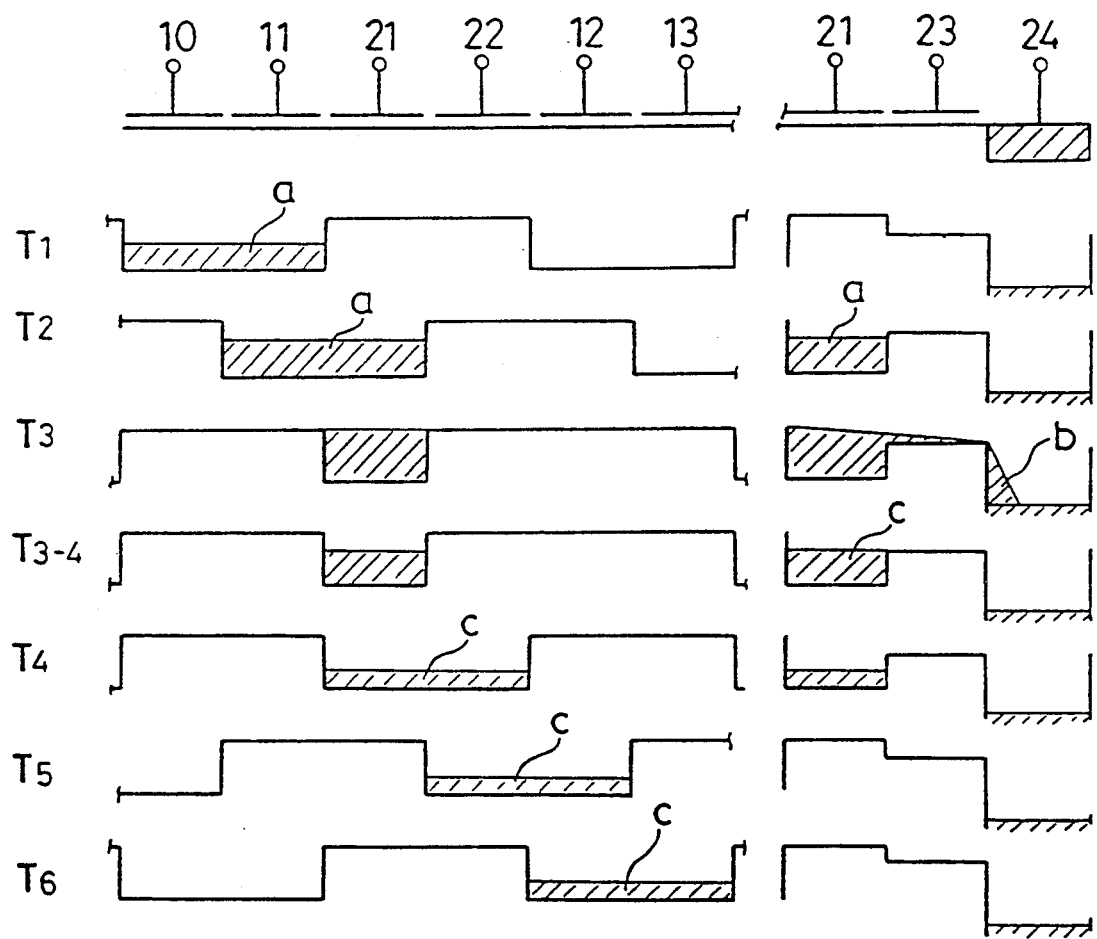
FIG. 10 is a diagram showing potentials of the background signal charge removing part of the T.D.I. operation type solid-state imager of FIG. 9.

Then during the period from time $T_3$ to time $T_4$, the voltage of the clock pulse $\phi_4$ applied to the charge transfer control gate electrode 22 is raised and as shown by time $T_4$ of FIG. 10, the signal charges at and below the storage gate electrode 21 move and signal charges are also stored at and below the charge transfer control gate electrode 22.

During the period from time $T_4$ to time $T_5$, the voltage of the clock pulse $\phi_3$ is lowered and the voltage of the clock pulse $\phi_1$ applied to the gate electrode 12 is raised. Accompanying therewith, the potential below the gate electrode 12 changes as shown by time $T_5$ of FIG. 5 and as a result, the signal charges move to and below the gate electrodes 22 and 12.

During the period from time $T_5$ to time $T_6$, the voltage of the clock pulse $\phi_4$ applied to the charge transfer control gate electrode 22 is lowered. As a result, the potential changes as shown by time $T_6$ of FIG. 10 and the movement of signal charges are carried out. The processing of signal charges thereafter is the same as that in the above-described embodiment.

Figure 11:
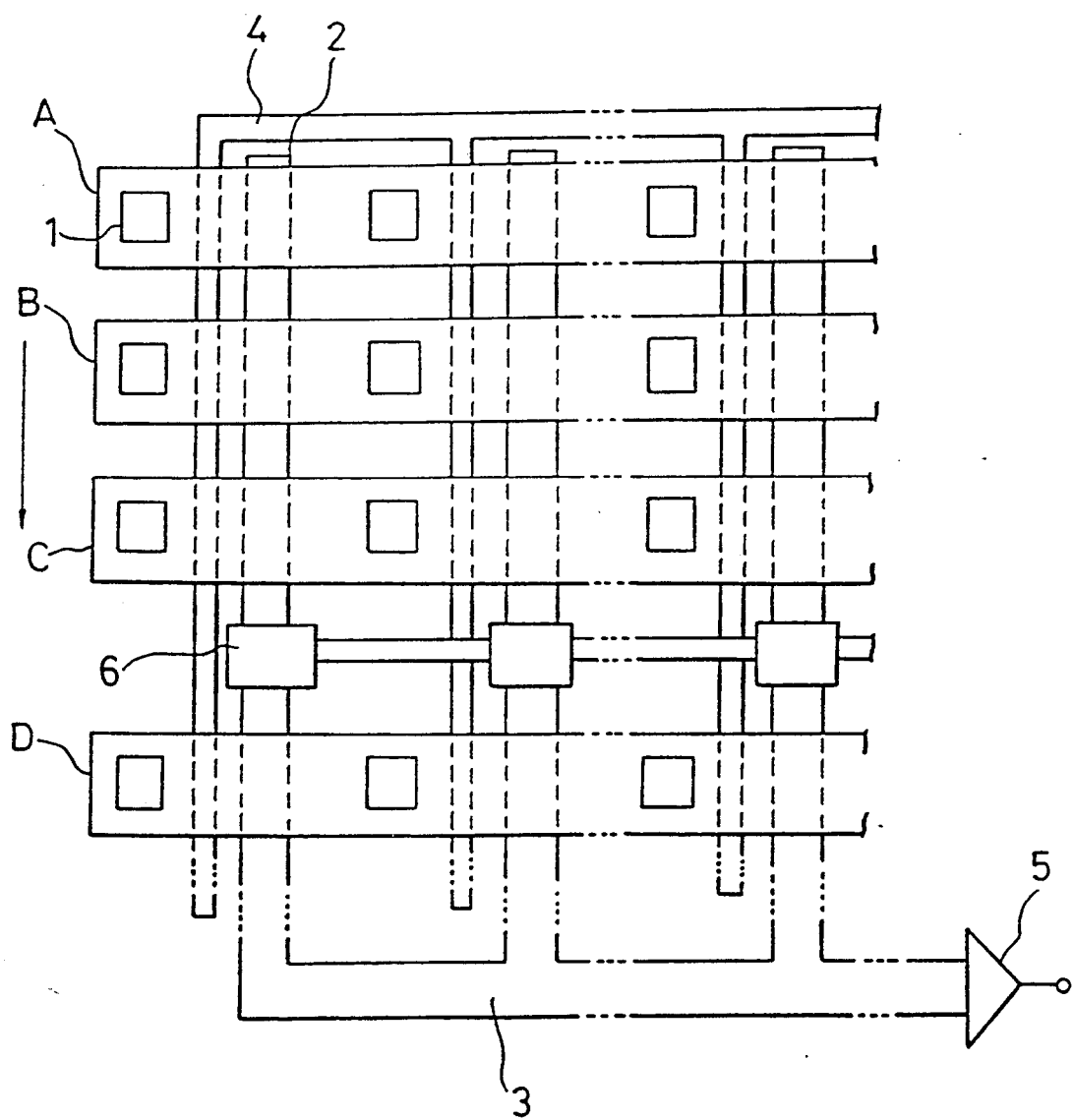
FIG. 11 is a diagram showing a construction of a T.D.I. operation type solid-state imager in accordance with a third embodiment of the present invention.

In the above-illustrated embodiment a one-dimensional solid-state imager of one column is described, but in order to broaden the view field, a one-dimensional solid-state imager in which a plurarity of sets of light-to-electricity conversion part 1, vertical CCD 2, transfer gate 4, and charge removing part 6 are arranged can be also constructed. In this case, however, the region in which the observed image is focused on the apparatus is lengthened in the row direction as shown in FIG. 11. Furthermore, the reading out, transfer, and removal of background signal charges are carried out at the sam time for all sets, and the signal charges read out from the respective vertical CCD 2 to the horizontal CCD 3 are sequentially output in the horizontal CCD from those close to the output part. Thereby, a wide view one-dimensional solid-state imager of high sensitivity is realized.

Furthermore, the background signal charge removal part 6 can be provided in an arbitrary number at arbitrary locations in the vertical CCD.

The sizes of the elements which are actually used are a pixel size of 30 microns × 20 microns, the pixel pitch in horizontal direction is about 60 microns, and the pixel pitch in the vertical direction is about 30 microns.

As is evident from the foregoing description, according to the present invention, a region for removing background signals is provided at a vertical CCD between pixels and therefore a solid-state imager effectively suppressing blooming without increasing the capacitance of the vertical CCD and thereby lowering the numerical aperture, and carrying out a high sensitivity operation is obtained.

What is claimed is:

1. A one-dimensional time-delay integration solid-state imager comprising:
    a semiconductor substrate;
    a plurality of light-to-electricity conversion parts for storing signal charges generated in response to incident light, said light-to-electricity conversion parts being arranged on said semiconductor substrate;
    a vertical CCD disposed on said semiconductor substrate and including a plurality of stages extending from a first stage to a last stage, each stage corresponding to one of said light-to-electricity conversion parts, said vertical CCD transferring signal charges stored at respective light-to-electricity conversion parts;
    gate means for controlling transfer of signal charges stored at said light-to-electricity conversion parts to said corresponding stage of said vertical CCD wherein signal charges corresponding to an observed image moving across said plurality of light-to-electricity conversion parts are summed in said vertical CCD to enhance signal-to-noise ratio; and
    background signal charge removing means for removing background signal charges generated in response to background light, said background signal charge removing means being disposed at an intermediate stage, between the first and final stages, of said vertical CCD and including:
        a storage gate electrode for storing charges transferred from a preceding intermediate stage of said vertical CCD;
        a charge removal control electrode for draining background signal charges from signal charges stored at said storage gate electrode in response to application of a pulse of a predetermined voltage to said charge removal control electrode; and
        a charge transfer control gate electrode for transferring charges from which background signal charges have been removed from said storage gate electrode to a subsequent stage of said vertical CCD.

2. A one-dimensional time-delay integration solid-state imager comprising:
    a semiconductor substrate
    a plurality of light-to-electricity conversion parts for storing signal charges generated in response to incident light, said light-to-electricity conversion parts being arranged on said semiconductor substrate;
    a vertical CCD disposed on said semiconductor substrate and including a plurality of stages extending from a first stage to a last stage, each stage corresponding to one of said light-to-electricity conversion parts, said vertical CCD transferring signal charges stored at respective light-to-electricity conversion parts;
    gate means for controlling transfer of signal charges stored at said light-to-electricity conversion parts to said corresponding stage of said vertical CCD wherein signal charges corresponding to an observed image moving across said plurality of light-to-electricity conversion parts are summed in said vertical CCD to enhanced signal-to-noise ratio; and
    background signal charge removing means for removing background signal charges generated in response to background light, said background signal charge removing means being disposed at an intermediate stage, between the first and final stages, of said vertical CCD and including:
        a storage gate electrode for storing charges transferred from a preceding, intermediate stage of said vertical CCD; and
        a charge removal control electrode for draining background signal charges from signal charges stored at said storage gate electrode wherein a predetermined voltage is constantly applied to said charge removal control electrode to remove background signal charges.

3. A one-dimensional time-delay integration solid-state imager as defined in claim 1 wherein the pulse of a predetermined voltage applied to said charge transfer control electrode is a voltage at which a slight output is produced when there is no observed image incident on said light-to-electricity conversion parts.

4. A one-dimensional time-delay integration solid-state imager as defined in claim 2 wherein the predetermined voltage constantly applied to said charge removal control electrode is a voltage at which a slight output is produced when there is no observed image incident on said light-to-electricity conversion parts.

* * * * *